United States Patent [19]
Noji et al.

[11] Patent Number: 6,158,226
[45] Date of Patent: *Dec. 12, 2000

[54] TRAPPING DEVICE

[75] Inventors: Nobuharu Noji; Norihiko Nomura; Tetsuro Sugiura, all of Fujisawa; Yuji Matsuoka, Kakamigahara, all of Japan

[73] Assignees: Ebara Corporation, Tokyo; CKD Corporation, Aichi, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/990,582

[22] Filed: Dec. 15, 1997

[30] Foreign Application Priority Data

Dec. 16, 1996 [JP] Japan ................... 8-353174

[51] Int. Cl.⁷ .............. B01D 8/00; F25B 21/02; F25D 17/06
[52] U.S. Cl. .................. 62/55.5; 62/3.4; 62/93
[58] Field of Search ................... 62/55.5, 3.4, 93

[56] References Cited

U.S. PATENT DOCUMENTS

| | | | |
|---|---|---|---|
| 3,719,052 | 3/1973 | White | 62/55.5 X |
| 4,551,197 | 11/1985 | Guilmette et al. | 156/642 |
| 5,010,737 | 4/1991 | Okumura et al. | 62/55.5 X |
| 5,687,575 | 11/1997 | Keville | 62/55.5 |

FOREIGN PATENT DOCUMENTS

| | | |
|---|---|---|
| 12 29 984 | 12/1966 | Germany . |
| 44 38 874 | 5/1996 | Germany . |
| 58-106186 | 6/1983 | Japan . |
| 58-133586 | 8/1983 | Japan . |
| 156983 | 8/1985 | Japan ............. 62/55.5 |
| 38178 | 2/1986 | Japan ............. 62/55.5 |
| 1110880 | 4/1989 | Japan ............. 62/55.5 |
| 1-178787 | 7/1989 | Japan . |
| 4362283 | 12/1992 | Japan ............. 62/55.5 |
| 6066255 | 3/1994 | Japan ............. 62/55.5 |
| 1044889 | 10/1966 | United Kingdom . |

*Primary Examiner*—William Doerrler
*Attorney, Agent, or Firm*—Armstrong, Westerman, Hattori, McLeland & Naughton

[57] ABSTRACT

A trapping device is presented to improve production efficiency of vacuum processing devices. The trapping device comprises an exhaust path for evacuating process gas from a hermetic chamber through a vacuum pump; a regeneration path disposed adjacent to the exhaust path and comprising a regeneration means; not less than two trap sections communicable either with the exhaust path or with the regeneration path; and switching means for transposing the trap sections either to the exhaust path or to the regeneration path. A trapping operation and a regeneration operation can be performed concurrently respectively in the exhaust path and the regeneration path.

42 Claims, 9 Drawing Sheets

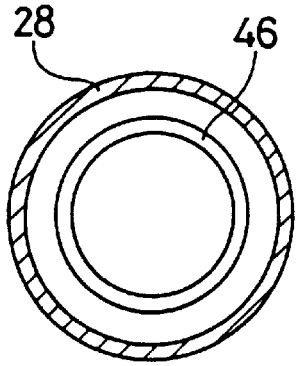 F I G. 3A
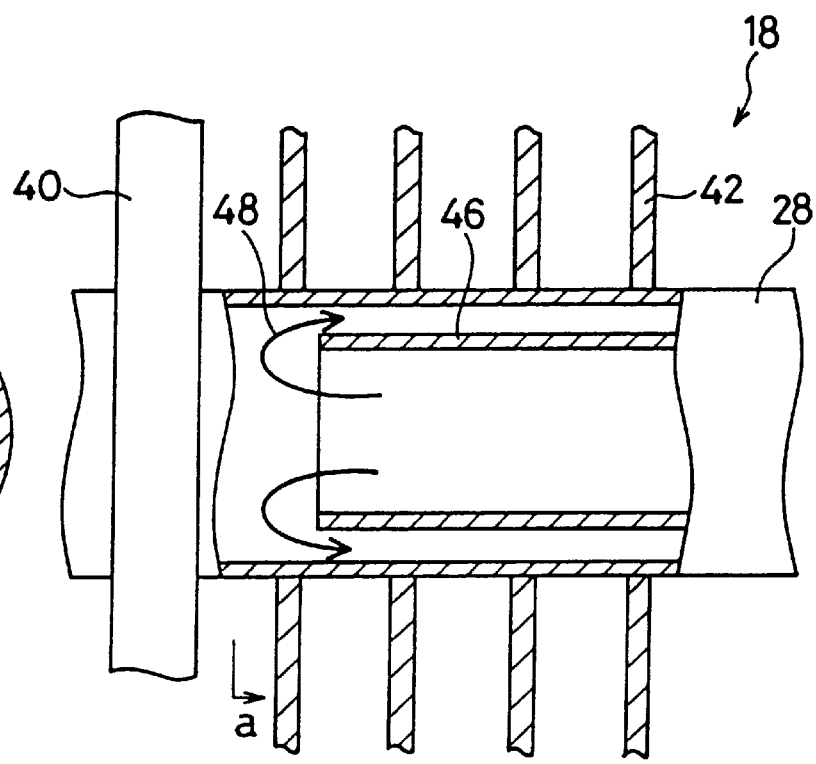 F I G. 3B

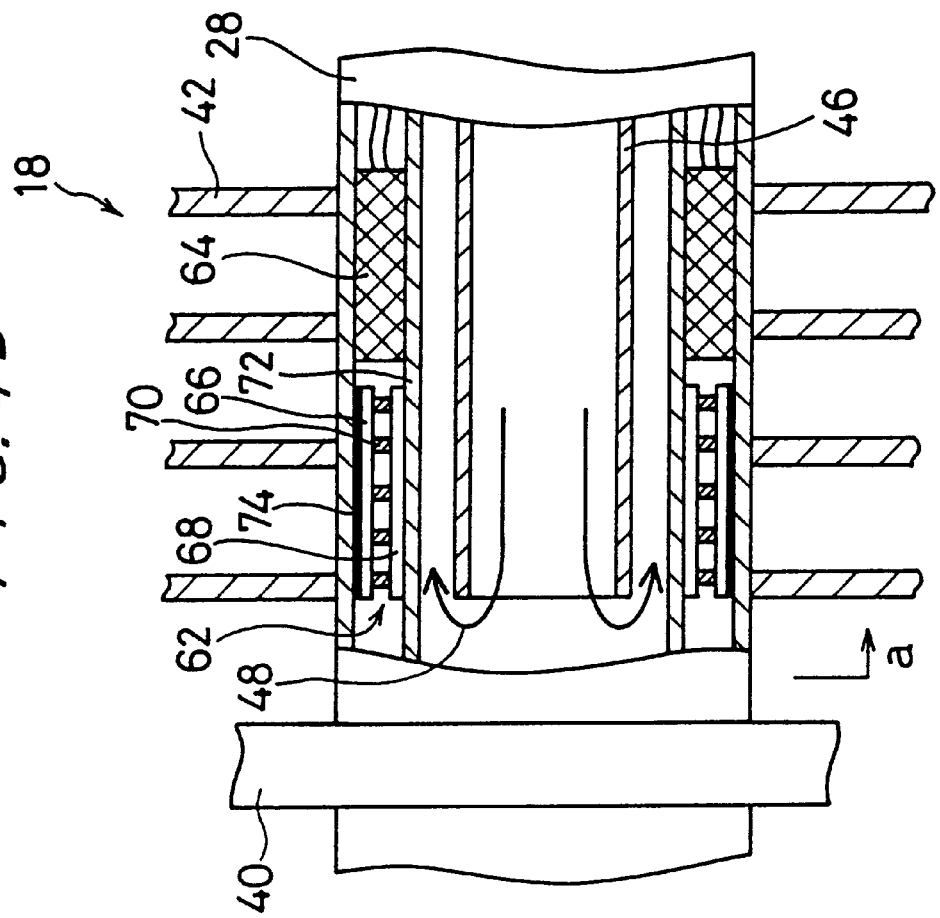
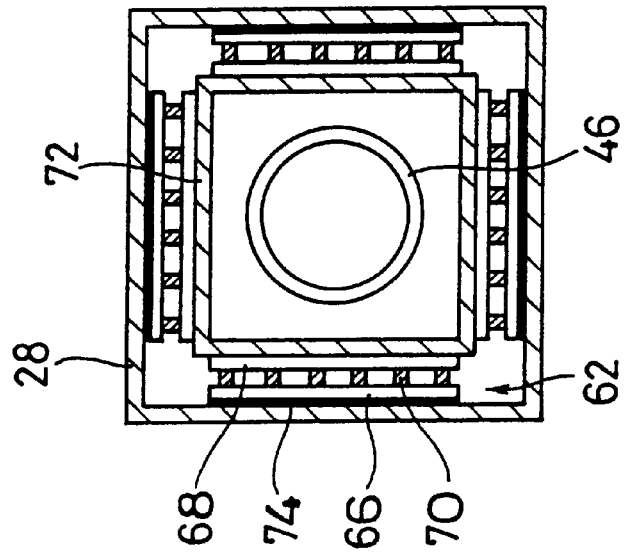

TRAPPING DEVICE

BACKGROUND OF THE INVENTION

1. Field of the Invention

The present invention relates to a trapping device used in, for example, an evacuation system for evacuating a vacuum chamber in a semiconductor manufacturing apparatus.

2. Description of the Related Art

A conventional evacuation system will be described with reference to FIG. 9. A vacuum chamber 101 is a processing chamber for processing semiconductor devices through processes such as etching or chemical vapor deposition (CVD). The processing chamber 101 is communicated with a vacuum pump 103 through a pipe 102. The vacuum pump 103 is used to raise the gas pressure of the spent gas from the processing chamber 101 to an atmospheric pressure, and in the past, oil-lubricated rotary pumps were common but modern pumps are mainly so-called dry pumps.

When the degree of vacuum required in the processing chamber 101 is higher than the performance capability of the dry pump 103, an ultra-high vacuum pump such as a turbo-molecular pump is provided upstream of the dry pump. A gas scrubber 104 is provided in a downstream location of the vacuum pump 103, and depending on the characteristics of the exhaust gases, those gases which cannot be exhausted to the atmosphere directly, such as those that are poisonous or explosive, are treated in this device by such processes as adsorption, decomposition and absorption, and only the harmless gases are exhausted into the atmosphere. The pipe 102 is provided with valves in desired locations.

In such conventional vacuum systems, if the reaction byproduct contains a substance having a high sublimation temperature, that substance will leave a solid residue in the process of pressure rise and, in some cases, precipitate in the vacuum pump to cause failure of the pump.

For example, when aluminum is subjected to an etching process, using typical process gases such as $BCl_3$, $Cl_2$, the exhaust gas from the processing chamber 101 will contain a reaction byproduct $AlCl_3$ as well as residual gaseous $BCl_3$ and $Cl_2$.

Among these gases, $AlCl_3$ does not precipitate on the intake side of the vacuum pump where it has a low partial pressure, but while it is being pressurized to raise the partial pressure, it precipitates inside the vacuum pump and the solid particles adhere to the interior wall of the vacuum pump. This phenomenon is a cause of pump failure. Similar problems are encountered when byproducts such as $(NH_4)_2SiF_6$ and $NH_4Cl$ are formed for producing SiN thin film by CVD.

Conventional remedial approaches include:

(1) The vacuum pump is heated to maintain the pump at a high temperature so that the exhaust gas would not precipitate solid particles inside the pump and is eliminated through the pump in a gaseous state.

(2) A water-cooled trap is provided in an upstream location (intake side) of the vacuum pump so as to precipitate potential particles before they enter the vacuum pump.

In the first approach, although it is effective in preventing precipitation inside the vacuum pump, precipitation can still occur in a gas scrubber disposed downstream of the vacuum pump, and the resulting blockages of the filtering layers presented a serious operational and maintenance problems. In the second approach, the system has to be shutdown for cleaning of the traps resulting that the system productivity is sacrificed.

Therefore, it is desirable first to be able to trap potential particles in the spent exhaust gas and to regenerate the intercooler automatically without having to shut down the system. Such a system would assure long service life of the pump, provide protection for gas scrubbers and reduce time loss so that the operational reliability of the manufacturing system will be improved. It is further desirable that the system is able to reduce the cost of building and operating the trapping device.

SUMMARY OF THE INVENTION

It is an object of the present invention to provide a trapping device to enable trapping and regeneration operations to be performed concurrently in such a manner that the processing system can be controlled automatically without shutting down the system for trap regeneration. It is another object to provide a trapping device that can perform such trapping operations efficiently so as to raise the overall operational reliability by improving the service life and lowering the capital and operation cost of the processing system.

The object has been achieved in a trapping device comprising: an exhaust path for evacuating process gas from a hermetic chamber through a vacuum pump; a regeneration path disposed adjacent to the exhaust path and comprising a regeneration means; not less than two trap sections communicable either with the exhaust path or with the regeneration path; and switching means for transposing the trap sections either to the exhaust path or to the regeneration path so that a trapping operation and a regeneration operation can be performed concurrently and respectively in both the exhaust path and the regeneration path.

Accordingly, the trapping device eliminated the need for shutting down the system for exchanging the trap or the need to have spare traps so that the hermetic chamber can be operated continually without interruption. Coupled with a suitable exchange timing device, the processing system can be operated totally automatically.

The hermetic chamber may be a semiconductor processing chamber, and as necessary, a gas scrubber can be provided for detoxifying or safening the spent gas. It is preferable that the vacuum pump be a dry type in which lubricant is not used in the evacuation passage to avoid contamination by diffusion of lubricant oil vapors.

The not less than two trap sections may be connected to each other to move in a interlocking manner, or separated to be independently movable. The trap section may be housed in a trap chamber disposed in the evacuation path, and a regeneration chamber for accommodating another trap section may be provided in the regeneration path so that hermetic integrity of the system is maintained while switching the trap sections. The regeneration chamber may be provided with openings or ports to exhaust vaporized gaseous species.

The not less than two trap sections may be disposed parallel to a flow direction of the spent gas. The trap sections may be moved in a linear manner or may be rotated about an axis parallel to the path.

The not less than two trap sections may be disposed transversely to a flow direction of said exhaust path or a flow direction of said regeneration path.

The trap section may be a temperature-controlled trap, and is cooled when communicating with said exhaust path and is heated when communicating with said regeneration path.

The trap section may be transposed automatically according to a control signal indicating a trapped amount directly or indirectly.

When the trap section is to function as a temperature-controlled trap, temperature may be controlled by flowing a thermal medium from an external source, such as cooled water or other coolant, or a liquid substance (e.g. liquid nitrogen) capable of utilizing vaporization heat thereof. Thermoelectric cooling based on Peltier elements or by Pulse-tube refrigerator can provide cooling without using a cooling medium.

Similarly, regeneration operation may be performed using a thermal medium or electrical heating, thermoelectric heating or by natural phenomena. Released gases can be retrieved together with the thermal medium (usually gaseous) or retrieved separately, and in the latter case, a thermal medium path for regeneration medium is separately provided. The trap may be constructed with baffle plates so as to enhance contact between the spent gas and the trap section by providing tortuous paths and increased contact surface area.

The trap section may be switched by using air cylinder. In this case, the drive may be operated by an air drive controller including solenoid valves and speed controllers, so that the controller may be regulated by a sequencer or by signals from a relay device.

The trap sections may be operated totally automatically without any human intervention by selecting appropriate control methods, such as: switching the trap section when indicated by pressure sensors to detect the differential pressures between fore- and aft-trap locations; or more simply, they may be switched after a given period of operation of the trap sections. When there is only one regeneration path for one exhaust path, both devices are in use for the same duration, so it is desirable to arrange the two devices such that the regeneration capability is higher than the trap capability, because regeneration process generally needs a longer duration of time.

BRIEF DESCRIPTION OF THE DRAWINGS

FIGS. 3A & 3B are enlarged cross sectional views of the trap section shown in FIG. 1.

FIGS. 4A & 4B are enlarged cross sectional views of the trap section of another embodiment of the present invention.

DESCRIPTION OF THE PREFERRED EMBODIMENTS

Figure 1:
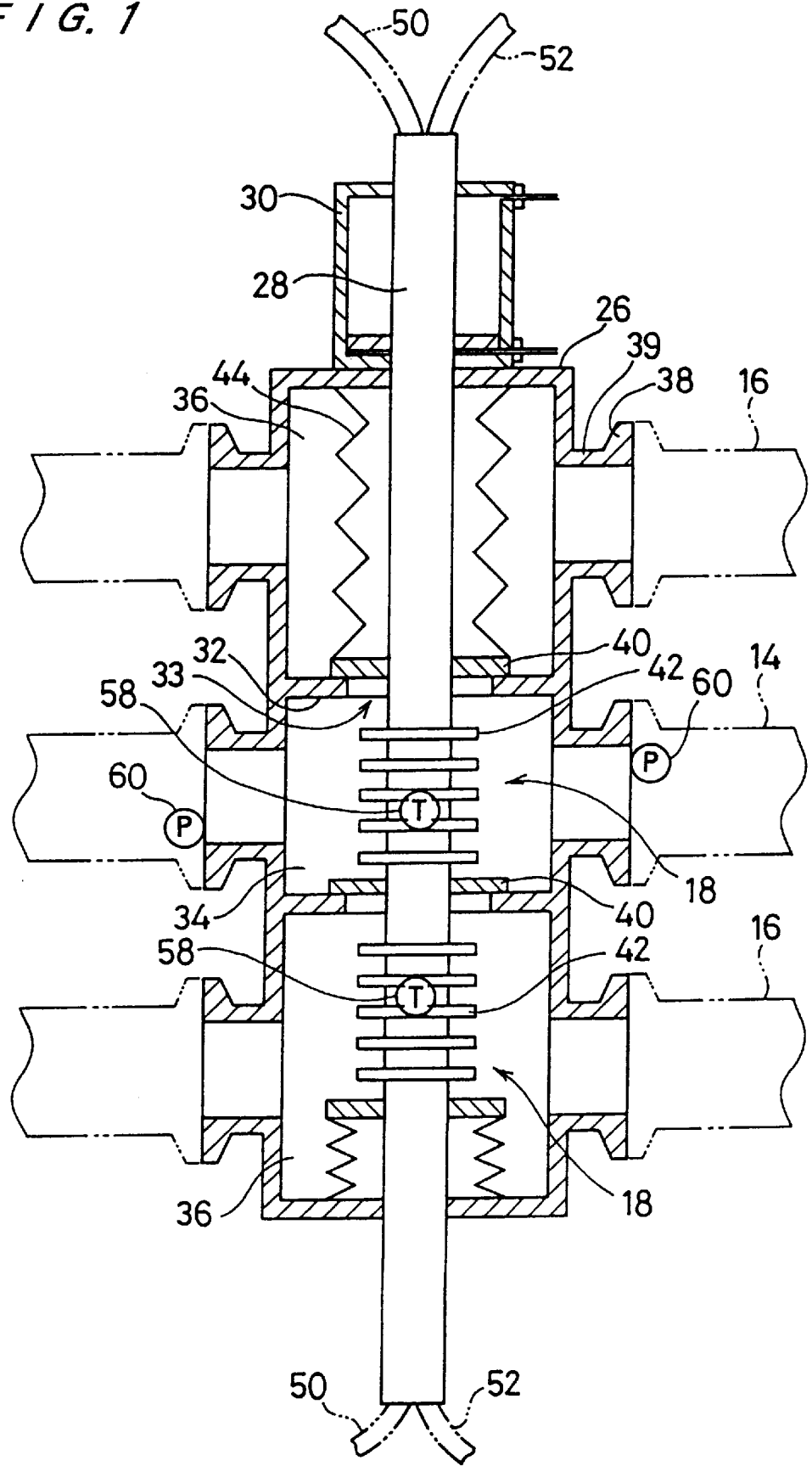
FIG. 1 is a cross sectional view of an embodiment of the trapping device of the present invention.
Figure 2:
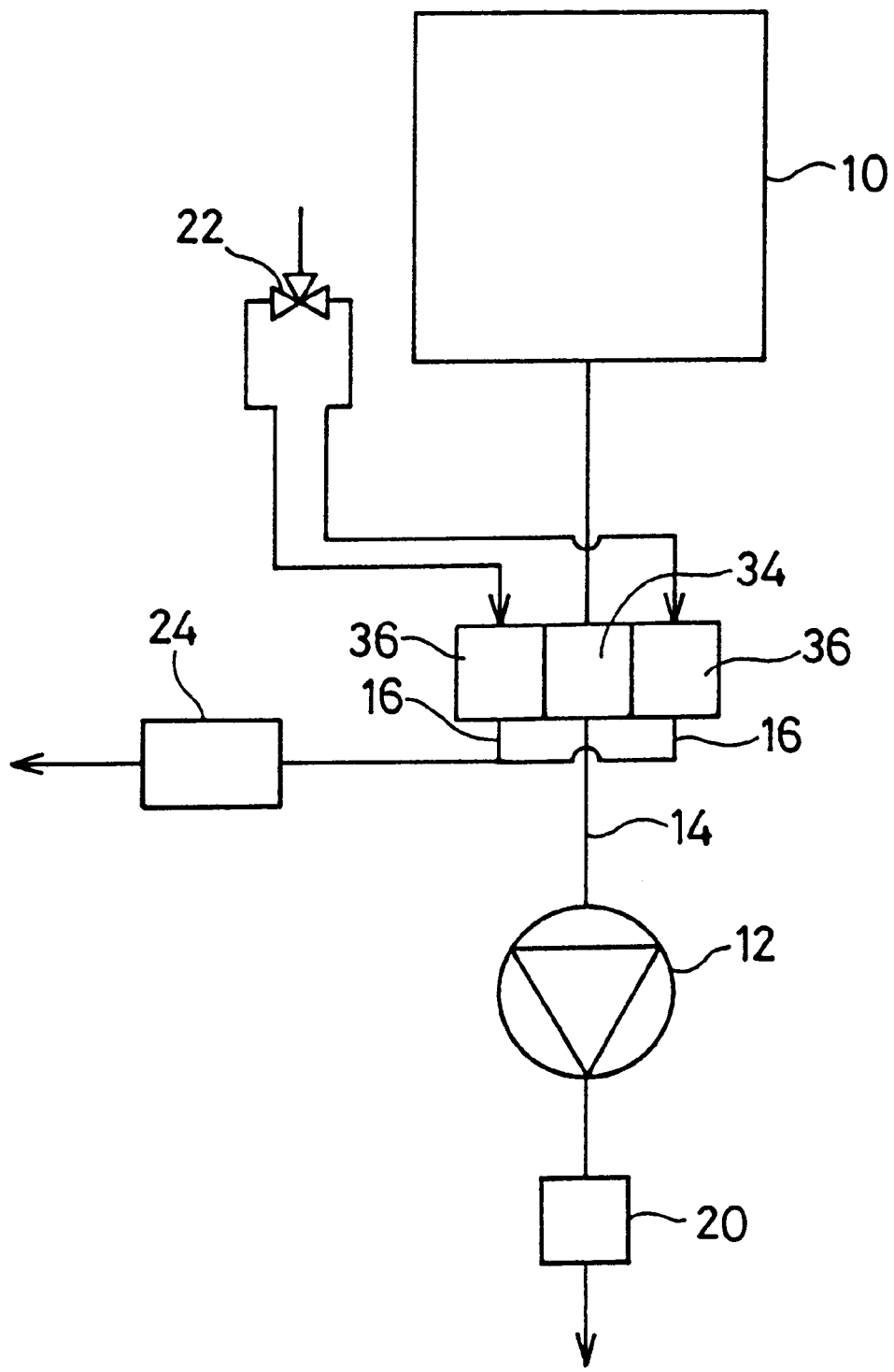
FIG. 2 is a schematic drawing of a vacuum system for use with the trapping device shown in FIG. 1.

Several embodiments of the trapping device according to the present invention will be presented with reference to FIGS. 1–8. FIGS. 1 shows a first embodiment of the trapping device and FIG. 2 shows an evacuation system using the trapping device. The system comprises a hermetic chamber 10 and a vacuum pump 12 communicated through an exhaust path 14, two adjacent regeneration paths 16 disposed on the right and left of the exhaust path 14 and two trap sections 18 which are placed so as to be interchangeable by moving in a direction to traverse the exhaust path 14 and the regeneration path 16. The vacuum pump 12 is a single stage pump, but a multi-stage pump may also be used. A gas scrubber 20 is disposed downstream of the vacuum pump 12.

A regeneration gas from a regeneration gas source (not shown) is supplied to the regeneration path 16 for vaporizing the trapped precipitates by heating and transporting the vaporized gas through a branch path and a three-way switching valve 22. The downstream side of the trapping device in the regeneration path 16 is provided with a gas scrubber 24, which may be omitted by sharing the gas scrubber 20.

With reference to FIG. 1, the trapping device includes a rectangular casing 26 traversing the exhaust path 14 and the regeneration path 16, a transposing shaft 28 transversely crossing the casing 26, and an air cylinder 30 as a drive means for producing a reciprocation motion along the transposing shaft 28. The casing 26 is divided into three spaces in the transverse direction by partition walls 32, into a central trap chamber 34 and two regeneration chambers 36 on both sides, and each chamber has a port connection 39, having a flange 38, to communicate with either the exhaust path 14 or the regeneration path 16.

The transposing shaft 28 has three equally-spaced partition plates 40, made of a thermal insulating material, and a plurality of baffle plates 42 between the partition plates 40 are integrally fixed to the transposing shaft 28 by welding, for instance, to maintain a good thermal conduction therebetween. The partition walls 32 of the casing 26 are provided with a center opening 33, of a size to permit the baffle plates 42 to pass through but not the partition plates 40. A bellows 44 is provided between the two transverse end walls of the casing 26 and the countering two partition plates 40 respectively to maintain hermetic sealing between the regeneration path 16 and the external environment. The contact between the partition wall 32 and the partition plates 40 are made through an O-ring which is similar to the one shown in FIG. 7 to maintain hermetic sealing between the trap chamber 34 and the regeneration chamber 36. The partition plate 40 is made of a highly thermal insulating material so as to prevent heat transfer between the trap chamber 34 and the regeneration chamber 36.

As shown in FIG. 3A, the transposing shaft 28 is a cylindrical element made of a good thermal conductivity material, and its interior space is closed off with a central partition plate 40. The transposing shaft 28 has an inner tubes 46 inserted from both ends of the transposing shaft 28 into the vicinity of the central partition plate 40, as shown in FIG. 3B. The space between the two tubes constitutes a thermal medium passage 48 for a thermal medium to enter into the inner tube 46 and, upon hitting the central partition plate 40, to return through the outer space to the outer end of the shaft 28.

A cooling medium such as liquid nitrogen, chilled air or chilled water is supplied from a supply hose 50, circulated through the thermal medium passage 48 and discharged from a discharge hose 52 connected to each end of the transposing shaft 28. Of the two thermal medium passages 48 connected to the ends of the transposing shaft 28, only one passage connected to the trap chamber 34 having the baffles 42 is used for delivering the cooling medium, and cooling medium is shut off from the other passage connected to the regeneration chamber 36 and may be used instead to deliver a heating medium. In this example, the hoses 50, 52 are connected to the end of an air cylinder, and therefore, it requires less space than a case of connecting them between the air cylinder 30 and the casing 26.

Figure 5:
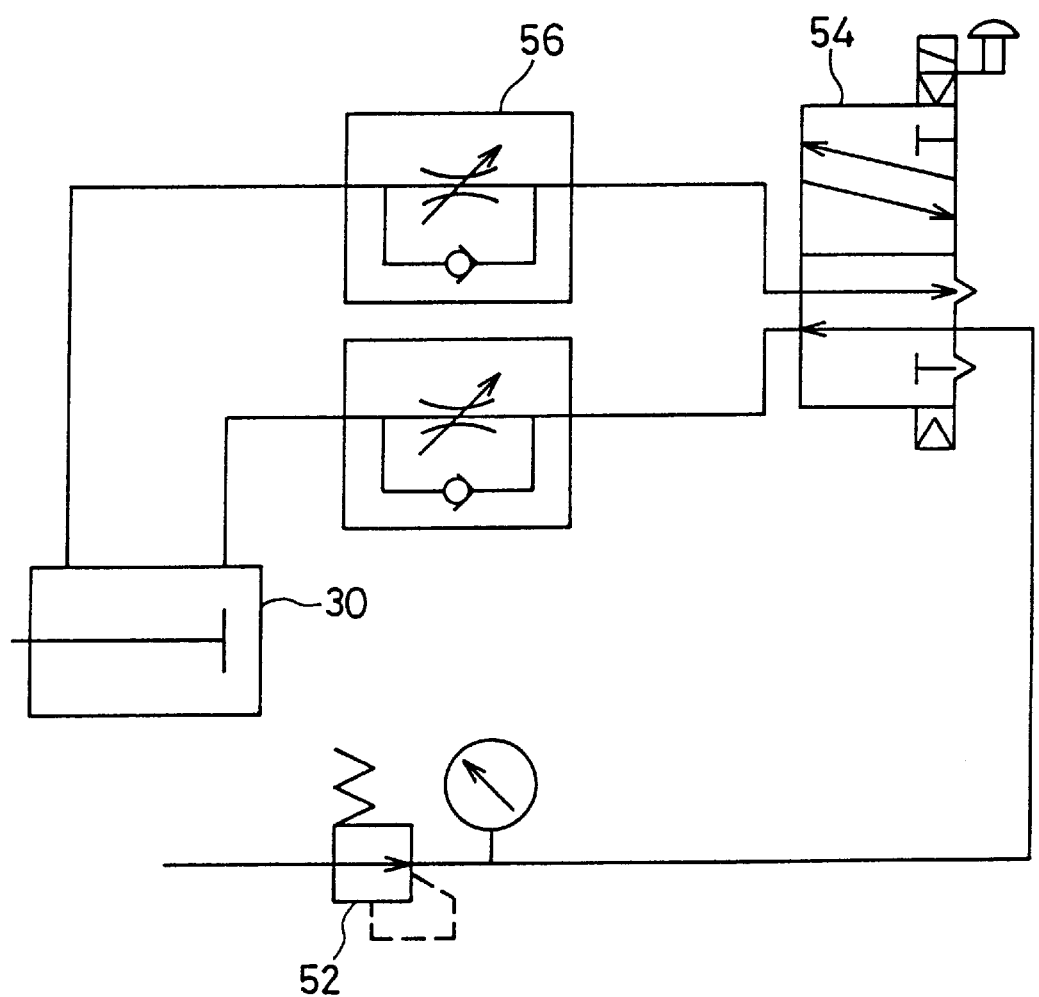
FIG. 5 is a schematic drawing of the drive circuit for the air cylinder.

FIG. 5 shows the piping arrangement for delivering air pressure to the air cylinder 30. The air pressure from an air source is reduced in a regulator 52, and is used to operate the cylinder 30 to move the piston (not shown) forward or backward according to electromagnetic switching signals generated by a solenoid valve 54. The speed of the air cylinder 30 is regulated by a speed controller 56. The solenoid valve 54 is controlled by control signals from, for example, sequencer or relay, and in this case, it exchanges the traps after a predetermined period of time of operation of the trap.

A temperature sensor 58 is provided in a suitable location at the baffles 42 in the trap section 18, and pressure sensors 60 are provided in fore- and aft-locations of the trap section 18 in the exhaust path 14. These sensors enable to indirectly monitor the trap performance based on temperatures and pressures. The temperature sensor 58 can also be used to control regeneration of feed material by differentiating separation parameters of the feed material from those of other precipitation products.

Next, the trapping process using the trapping device will be described. When the trap is positioned as shown in FIG. 1, a cooling medium such as liquid nitrogen, chilled air or chilled water is supplied from the supply hose 50 through the thermal medium passage 48 to the trap section 18 positioned in the trap chamber 34 to cool the baffles 42 through the transposing shaft 28. Therefore, certain elements of the exhaust gas are precipitated in the trap chamber 34 and adheres to the baffles 42.

Figure 6:
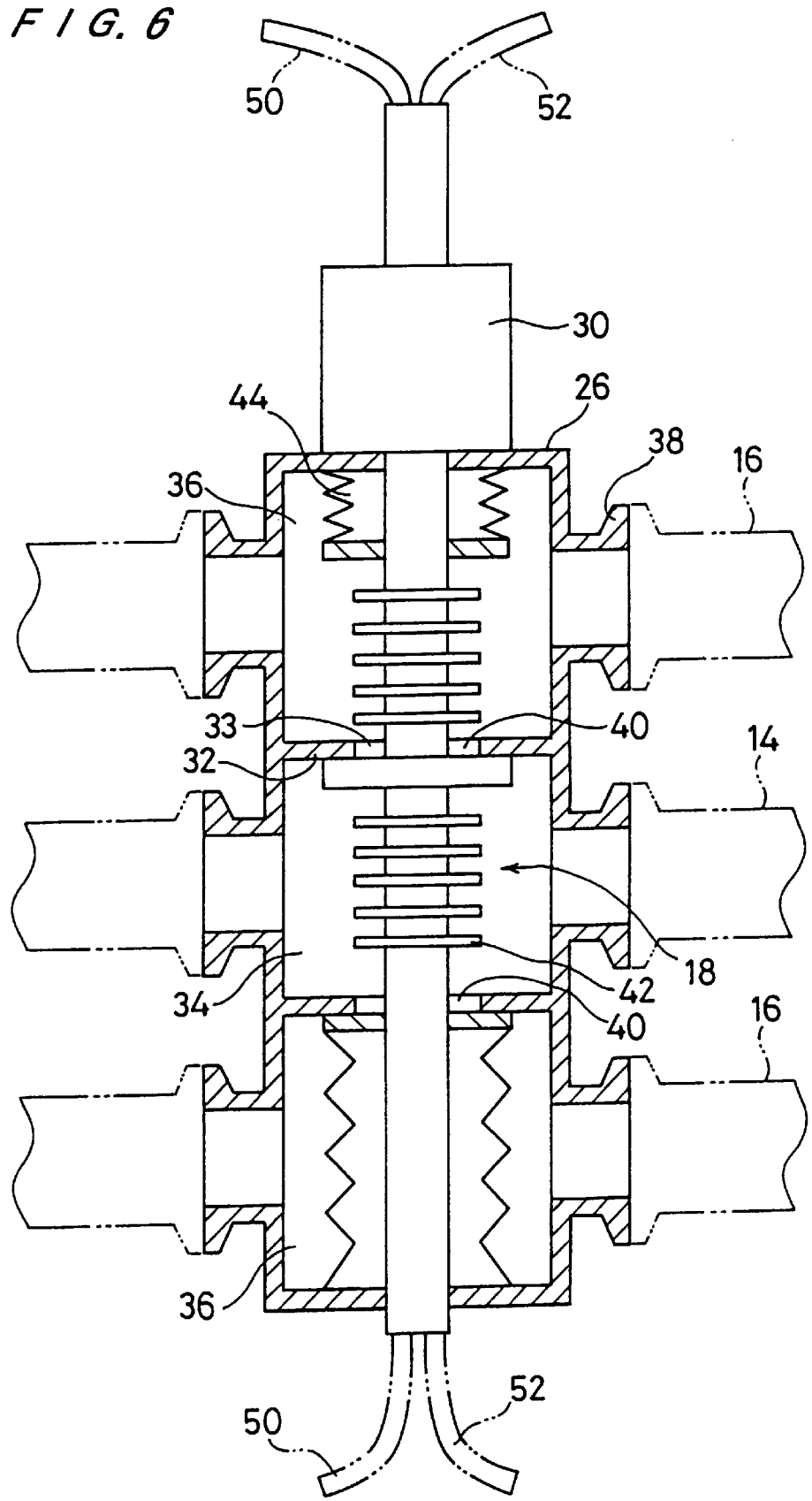
FIG. 6 is a cross sectional view of the trapping device after a switching operation.

After a certain period of trap operation, the air cylinder 30 is activated, which changes the position of the trap section from that shown in FIG. 1 to that shown in FIG. 6. The trap section 18 regenerated in the regeneration chamber 36 is transposed to the trap chamber 34, and the trap section 18 located in the trap chamber 36 is transposed to the other regeneration chamber 36 so that trapping and regeneration operations are carried out in respective chambers 34, 36.

In carrying out the processes presented above, because the partition plate 40 is made of a thermal insulating material to thermally isolate the trap chamber 34 and the regeneration chamber 36, there is little loss of thermal energy, and trapping and regeneration operations can be carried out quite efficiently. Also, because the regeneration chamber 36 and the transposing shaft 28 are hermetically sealed with the bellows 44, thermal energy loss as well as loss of processing efficiency caused by heat transfer between the chamber 38 and the external environment are minimized. This arrangement assures stable trapping and regeneration operations as well as prevention of infiltration of contaminating elements into the exhaust path 14.

FIG. 4 shows another way of cooling the baffles in the trapping device shown in FIG. 1. The space between the transposing shaft 28 and the inner tube 46 is provided with a cooling device 62 based on a thermoelectric cooling device (Peltier device). A radiation tube 72 is provided between the transposing shaft 28 and the inner tube 46, and the radiation plates 68 of the cooling device 62 is attached to the radiation tube 72, and the cooling plates 66 are attached to the transposing shaft 28 with a spacer 74 made of a highly thermally conductive material such as indium. Within the same space as the cooling device, a heater 64 for regeneration process is also provided.

In this embodiment, the cooling device 62 using the thermoelectric elements 70 is activated when the trap section 18 is located in a trap position, and the heat medium passage 48 is provided with a cooling gas such as nitrogen, whereas heater 64 is activated when the trap section 18 is located in a regeneration position. Since the thermoelectric element can provide cooling and heating only by supplying electric energy, the trap system is made simple, installation cost is low and maintenance is easy. Operation is uncomplicated involving relatively simple cooling and on/off temperature control, for example. Also, the cooling/heating effects can be reversed by reversing the polarity of D.C. electricity source, therefore, the heater 64 can be eliminated by employing polarity switching on the power supply.

Figure 7A:
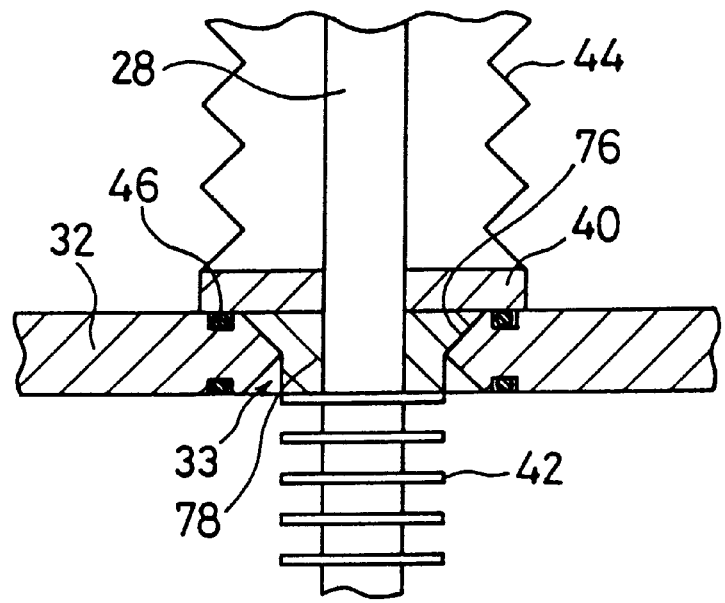
FIGS. 7A & 7B are cross sectional views of other examples showing sealing portions of the trapping device.
Figure 7B:
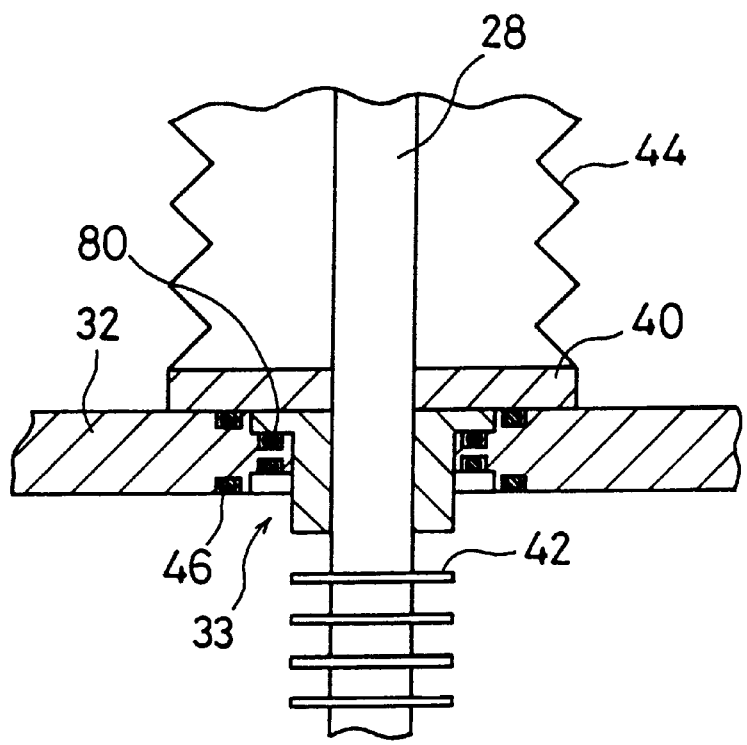

Alternative sealing methods are shown in FIGS. 7A and 7B. In FIG. 7A, the peripheral region of the opening section 33 of the partition wall 32 is made into a tapered surface 76, and an elastic packing 78 is provided on the partition plate 40 to seal against the tapered surface 76. A hermetic sealing is produced by the action of the tapered surface 76 bearing against the elastic packing 78. If the durability of the sealing parts is important, a harder substance such as a metallic packing may be used. FIG. 7B shows a type of sealing provided by a stepped section 80 formed on the periphery of the opening section 33 with an intervening O-ring 74 to for enhancing the sealing effect.

Temperature sensor 58 provided in the trap section 18 and pressure sensor 60 provided in the exhaust path 16 allow monitoring of operating conditions inside the trap chamber so that, should an abnormal condition develops, a warning signal can be released to take quick remedial steps. For example, an abnormal increase in the temperature of the trap section 18 or an increase in the pressure difference would indicate an increase in thermal load due to the deposition of precipitates. Such a warning can be dealt with, for example, by exchanging the trap even before its allotted time is expired. Of course, such warning signals may be used for basis for switching the trap sections 18.

In the above embodiments, the trap sections are interchanged by a linear movement within the casing 26, it can be interchanged by a rotational movement about an axis parallel to the path by constructing the casing to have a circular cross section. In this case, not less than three trap sections can be provided and not less than two of them are regenerated simultaneously in not less than two regeneration paths 16. This feature is useful, because regeneration processes are generally more time consuming than trapping processes. In this rotary type of trap system, one regeneration path is sufficient for trapping device having two trap sections.

Figure 8:
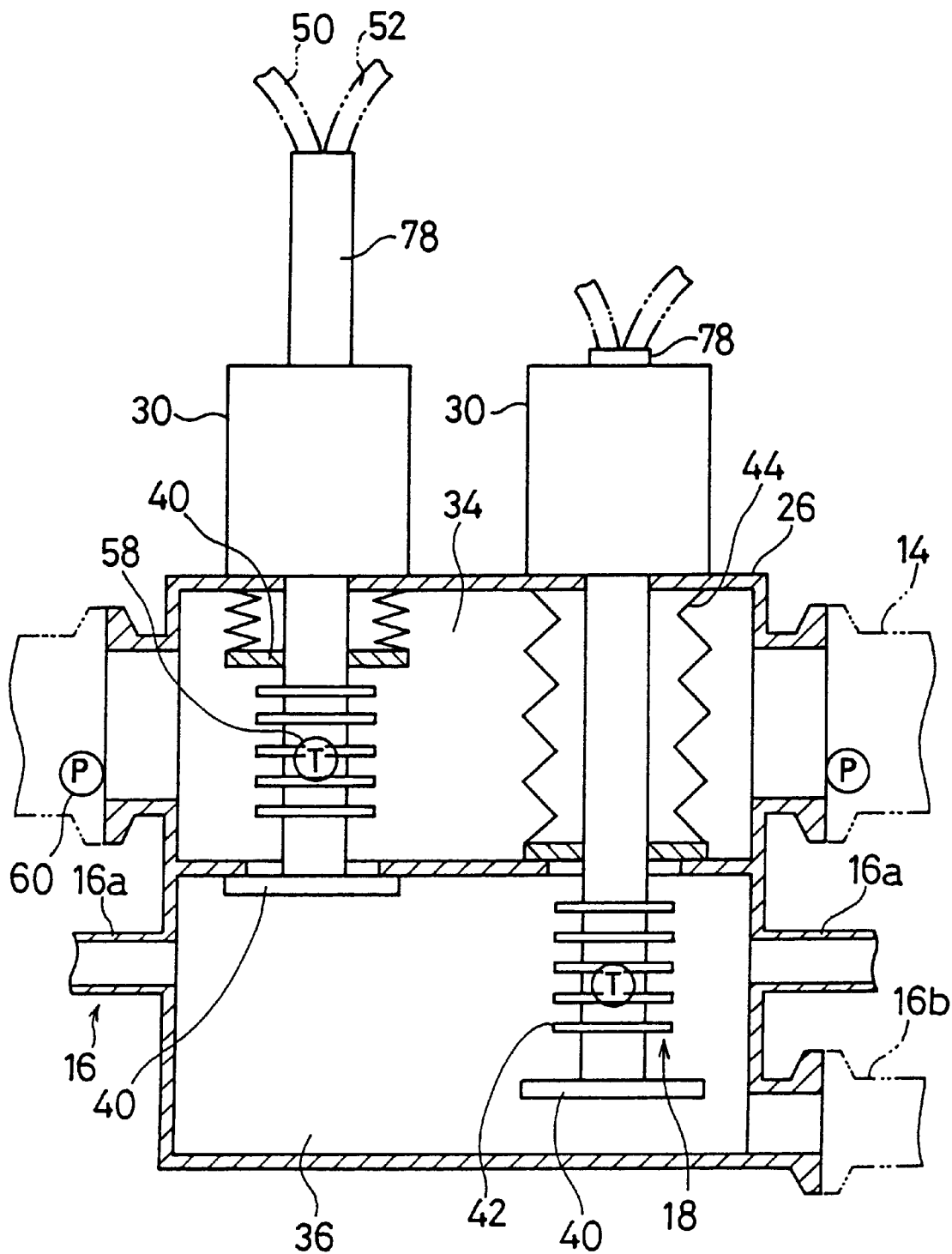
FIG. 8 is a cross sectional view of another example of the trapping device of the present invention.
Figure 9:
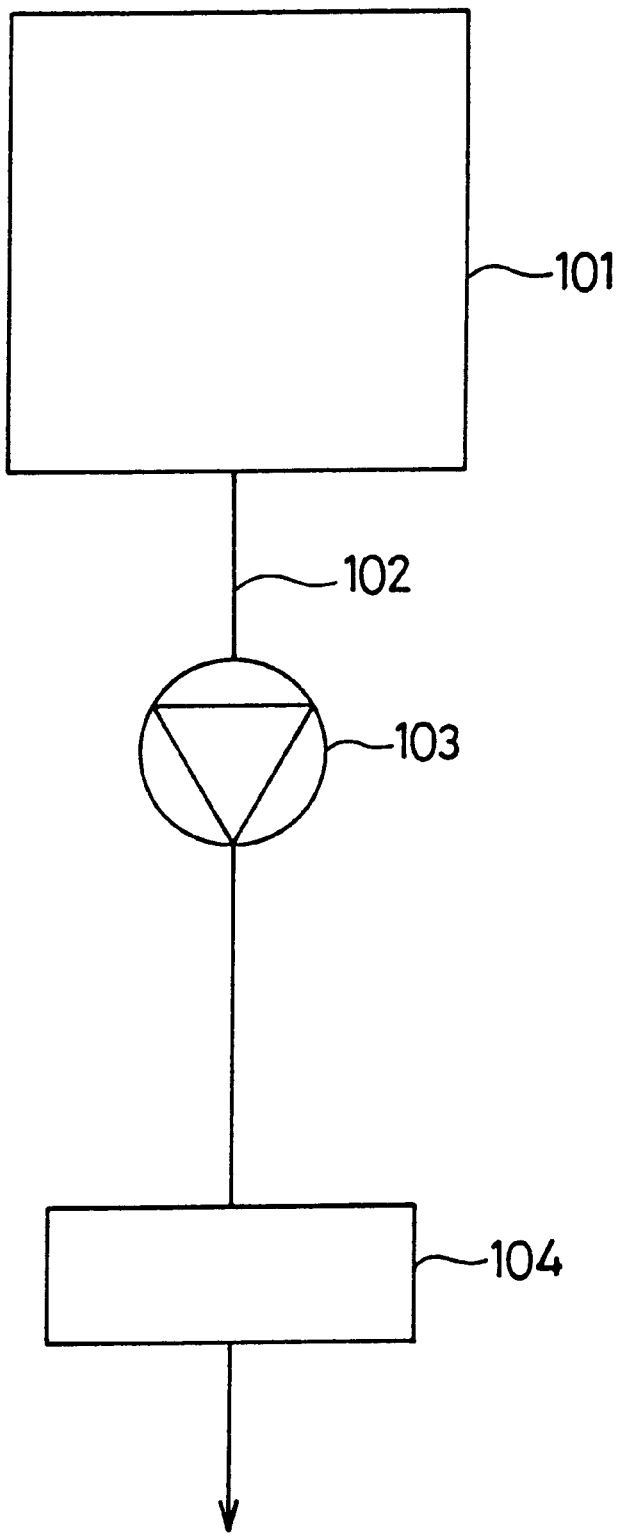
FIG. 9 is a schematic drawing of a conventional vacuum system.

FIG. 8 shows another embodiment of the invention having a plurality of trap sections 18 arranged in series in the exhaust direction. In this case, a regeneration path 16 is arranged in parallel downstream of the exhaust path 14. The casing extends in the exhaust direction and is provided with a plurality of transposing shafts (two in the drawing) to produce a reciprocating motion by air cylinder. One transposing shaft is assigned to each trap section 18, and each trap section 18 can be independently transferred to either a trap chamber 34 or a regeneration chamber 36.

Although this system operates in the same way as the previous apparatus by interchanging the trap section 18 to either the trap chamber 34 or the regeneration chamber 36, this system is advantageous because only one regeneration path is required so that the apparatus may be made more compact. It presents a flexibility that the number of trap sections 18 can be adjusted depending on the operational requirement of the system. For example, if the exhaust volume or precipitation volume increases suddenly, regeneration process can be stopped temporarily so that both trap sections can be placed in the trapping position. This advantage is multiplied by utilizing at least three trap sections. This is because the choice of placing the trap sections in either regeneration or trap position is significantly increased.

The operational procedure of this system is different from the previous system in that the regeneration process is carried out by washing the trapping sections with a cleaning solution. The regeneration chamber 36 is provided with a cleaning solution supply pipe 16a opening at the upper portion and a cleaning solution discharge pipe 16b connected to the lower portion. In this embodiment, a plurality of supply pipes 16a are provided at corresponding locations to the trap sections 18.

In this trapping device, in the state shown in FIG. 8 after interchange of the trap sections 18, a suitable cleaning solution for dissolving the adhering substances is introduced through the inlet opening 16a and is discharged through the outlet 16b. As necessary, the process may be repeated, solution may be sprayed, ultrasonic cleaning may be applied or the cleaning chamber 36 may be filled with the cleaning solution. Or, the cleaning solution may be changed to another type to conduct additional cleaning steps or rinsing steps. To avoid infiltration of the cleaning solution into the vacuum pump and peripheral devices, the trap sections are dried with a drying gas.

Such a regeneration apparatus based on cleaning solutions does not require to have the regeneration chamber 36 operate at elevated temperatures, therefore, measures to prevent heating affecting the performance of the trap chamber 34 can be minimized. Also, compared with the regeneration approach based on evaporating the precipitates, the regeneration capacity as well as processing speed are higher. Furthermore, compared with the evaporation approach, post-processing treatments are simpler, and especially, recycling of regenerated substances and storage are more convenient.

Also, the configuration shown in FIG. 8 has the washing chamber 36 disposed below the trap chamber 34, so that there is no danger of the cleaning solution seeping into the trap chamber 34, and therefore, this type of arrangement is most suitable for regeneration using solutions.

What is claimed is:

1. A trapping device comprising:
   a trap chamber connected to an exhaust path for evacuating process gas from a hermetic chamber through a vacuum pump;
   a first regeneration chamber positioned on one side of said trap chamber and a second regeneration chamber positioned on an opposite side of said trap chamber, said regeneration chambers connected to a regeneration path comprising a regeneration means;
   a transposing shaft extending through said trap chamber and said regeneration chambers;
   two trap sections attached to said transposing shaft;
   whereby each of said trap sections is capable of being transposed to either said trap chamber or to said regeneration chamber so that a trapping operation and a regeneration operation can be performed concurrently respectively in said trap chamber and in said regeneration chamber.

2. A trapping device according to claim 1, wherein said trap sections are connected to be interlockingly transposable.

3. A trapping device according to claim 1, wherein said transposing shaft provides a linear movement to said trap sections.

4. A trapping device according to claim 1, wherein said transposing shaft provides a rotational movement to said trap sections.

5. A trapping device according to claim 1, wherein said trap section comprises a low temperature area for depositing elements within said process gas thereon.

6. A trapping device according to claim 5, wherein said trap section comprises a heat medium passage for flowing a low temperature heat medium.

7. A trapping device according to claim 5, wherein said trap sections comprise a thermoelectric cooling device.

8. A trapping device according to claim 5, wherein said regeneration chambers comprises a heater for heating said trap sections.

9. A trapping device according to claim 8, wherein said heater comprises a heat medium passage for flowing a high temperature heat medium.

10. A trapping device according to claim 8, wherein said heater comprises an electric heater.

11. A trapping device according to claim 8, wherein said heater comprises a thermoelectric heating device.

12. A trapping device according to claim 1, wherein said regeneration chambers comprises a cleaning solution supplying means for cleaning said trap sections.

13. A trapping device according to claim 12, wherein said regeneration chambers comprises a drying means for drying said trap sections.

14. A trapping device according to claim 1, further comprising a sensor means for sensing the amount of trapped substance on said trap section directly or indirectly, and a control means for switching said trap sections based on the output signals of said sensor means.

15. A trapping device according to claim 1, wherein said trap sections comprises a shaft portion and a baffle portion fixed to said shaft portion.

16. A trapping device according to claim 15, wherein said shaft portion comprises a cooling means for cooling said baffle portion.

17. A trapping device according to claim 15, wherein said shaft portion comprises a heating means for heating said baffle portion.

18. A trapping device according to claim 1, further comprising two partition plates to isolate said trap chamber from one of said regeneration chambers, said partition plates attached to said transposing shaft.

19. A trapping device according to claim 1, further comprising a flexible closure member for providing a sealing between said transposing shaft and said regeneration chamber.

20. A trapping device comprising:
   an exhaust path communicating a hermetic chamber and a vacuum pump;
   a regeneration path with a regeneration device, said regeneration path disposed adjacent to said exhaust path;
   at least two trap sections switchably disposable either in said exhaust path or in said regeneration path; and
   switching device for transposing said trap sections either to said exhaust path or to said regeneration path,
   wherein said trapping device disposed in the midway of a evacuation path downstream of the hermetic chamber and upstream of the vacuum pump, each of said trap sections traps at least one specific gas element among elements flowing through said exhaust path when said each of said trap sections is disposed in said exhaust path, and said each of said trap sections is regenerated by said regeneration device when said each of said trap sections is disposed in said regeneration path wherein said trap sections are connected to be interlockingly transposable.

21. A trapping device according to claim 20, wherein said specific gas element has a tendency to precipitate within said exhaust path.

22. A trapping device according to claim 20, wherein said trap sections are disposed in parallel along a flow direction of said exhaust path or a flow direction of said regeneration path.

23. A trapping device according to claim 20, wherein said trap sections are disposed in series along a flow direction of said exhaust path or a flow direction of said regeneration path.

24. A trapping device according to claim 20, wherein said switching device provides a linear movement to said trap sections.

25. A trapping device according to claim 20, wherein said switching device provides a rotational movement to said trap sections.

26. A trapping device according to claim 20, wherein said trap sections are independently transposable from each other.

27. A trapping device according to claim 20, wherein said trap sections comprise a low temperature area to deposit said specific gas element thereon.

28. A trapping device according to claim 27, wherein said trap sections comprise a heat medium passage for flowing a low temperature heat medium.

29. A trapping device according to claim 27, wherein said trap sections comprise a thermoelectric cooling device.

30. A trapping device according to claim 27, wherein said regeneration device comprises a heater for heating said trap sections.

31. A trapping device according to claim 30, wherein said heater comprises a heat medium passage for flowing a high temperature heat medium.

32. A trapping device according to claim 30, wherein said heater comprises an electric heater.

33. A trapping device according to claim 30, wherein said heater comprises a thermoelectric heating device.

34. A trapping device according to claim 30, wherein said regeneration device comprises a cleaning solution supplying device for cleaning said trap sections.

35. A trapping device according to claim 34, wherein said regeneration device comprises a drying device for drying said trap sections.

36. A trapping device according to claim 20, further comprising a sensor for sensing the amount of trapped substance on said trap section directly or indirectly, and a controller for switching said trap sections based on the output signals of said sensor.

37. A trapping device according to claim 20, further comprising a hermetically sealed housing crossing over said exhaust path and said regeneration path for defining a trap chamber and a regeneration chamber therein, said trap sections being movable between said trap chamber and said regeneration chamber.

38. A trapping device according to claim 37, wherein said trap sections comprise a shaft portion connected to said switching device and a baffle portion fixed to said shaft portion.

39. A trapping device according to claim 38, wherein said shaft portion comprises a cooling device for cooling said baffle portion.

40. A trapping device according to claim 38, wherein said shaft portion comprises a heating device for heating said baffle portion.

41. A trapping device according to claim 37, further comprising a partition plate for operatively providing a seal between said trap chamber and regeneration chamber.

42. A trapping device according to claim 37, further comprising a flexible closure member for providing a seal between said trap sections and housing.

* * * * *

UNITED STATES PATENT AND TRADEMARK OFFICE
CERTIFICATE OF CORRECTION

PATENT NO. : 6,158,226
DATED : December 12, 2000
INVENTOR(S) : Noji et al.

It is certified that error appears in the above-identified patent and that said Letters Patent is hereby corrected as shown below:

Title page:
Change item [73] the assignee, to be -- Ebara Corporation, Tokyo, Japan --

Signed and Sealed this

Thirty-first Day of July, 2001

*Attest:*

*Attesting Officer*

NICHOLAS P. GODICI
*Acting Director of the United States Patent and Trademark Office*